(12) United States Patent
Voss et al.

(10) Patent No.: US 7,167,312 B2
(45) Date of Patent: Jan. 23, 2007

(54) BEAM SHAPING OPTICS AND MODULE FOR A DIODE LASER ARRANGEMENT

(75) Inventors: Andreas Voss, Schramberg (DE); Martin Huonker, Zimmern (DE); Martin Liermann, Villingen Schwenningen (DE); Klaus Wallmeroth, Zimmern (DE); Malte Kumkar, Schramberg (DE); Friedheim Dorsch, Zimmern o.R. (DE); Christian Schmitz, Dunningen (DE)

(73) Assignee: Trumpf Laser GmbH + Co. KG, Schramberg (DE)

( * ) Notice: Subject to any disclaimer, the term of this patent is extended or adjusted under 35 U.S.C. 154(b) by 13 days.

(21) Appl. No.: 11/138,900

(22) Filed: May 27, 2005

(65) Prior Publication Data

US 2005/0270652 A1 Dec. 8, 2005

(30) Foreign Application Priority Data

May 29, 2004 (EP) .................................. 04012863

(51) Int. Cl.
*G02B 27/10* (2006.01)
*H01S 3/098* (2006.01)
*H01S 3/04* (2006.01)
*H01S 3/091* (2006.01)

(52) U.S. Cl. ....................... 359/618; 359/619; 359/628; 359/629; 359/837; 359/834; 372/19; 372/32; 372/35; 372/69; 372/70; 372/75; 372/92; 385/39

(58) Field of Classification Search ................ 359/618, 359/619, 621, 624–626, 628, 629, 638–640, 359/837; 372/9, 19, 32–35, 43.01, 50, 50.1, 372/69, 70, 75, 92, 101; 385/39, 42; 356/139.03, 356/141.1, 400

See application file for complete search history.

(56) References Cited

U.S. PATENT DOCUMENTS 5,761,234 A * 6/1998 Craig et al. .................... 372/75

(Continued)

FOREIGN PATENT DOCUMENTS

| DE | 199 18 444 | 2/2001 |
|----|------------|--------|
| DE | 199 39 750 | 3/2001 |
| DE | 100 61 265 | 6/2002 |
| DE | 102 04 796 | 8/2003 |
| EP | 1 081 819  | 3/2001 |

*Primary Examiner*—Loha Ben
(74) *Attorney, Agent, or Firm*—Fish & Richardson P.C.

(57) ABSTRACT

A beam shaping optical arrangement combines three incoming laser beams that are mutually laterally offset in two orthogonal directions (X and Y), including an incoming first central laser beam and second and third incoming beams laterally offset in the X direction on either side of the central beam, into one outgoing combined laser beam. The arrangement includes two lateral displacement optical units though which the laterally offset incoming beams are transmitted and that laterally displace the two laterally offset incoming beams along the X direction towards the incoming central beam but which do not laterally offset the incoming central beam. The lateral displacement units include a material having a higher refractive index than a medium located in an optical path of the central laser beam, and the optical path length traversed by the incoming laterally offset laser beams is selected such that, after transmission though the optical units, the diameters of the central laser beam and the laterally offset laser beams are approximately equal at least in the X direction, and a divergence of the central laser beam is approximately equal to a divergence of the laterally offset laser beams.

17 Claims, 4 Drawing Sheets

U.S. PATENT DOCUMENTS

| | | | | |
|---|---|---|---|---|
| 5,784,203 A | * | 7/1998 | Beckmann | 359/618 |
| 5,887,096 A | * | 3/1999 | Du et al. | 385/39 |
| 5,900,981 A | | 5/1999 | Oren et al. | 359/619 |
| 6,028,722 A | * | 2/2000 | Lang | 359/834 |
| 6,160,664 A | * | 12/2000 | Du et al. | 359/628 |
| 6,356,574 B1 | * | 3/2002 | Craig et al. | 372/75 |
| 6,373,868 B1 | * | 4/2002 | Zhang | 372/19 |
| 6,377,410 B1 | | 4/2002 | Wang et al. | 359/837 |
| 6,873,639 B1 | * | 3/2005 | Zhang | 372/69 |

* cited by examiner

BEAM SHAPING OPTICS AND MODULE FOR A DIODE LASER ARRANGEMENT

CLAIM OF PRIORITY

This application claims priority under 35 USC § 119 to European Patent Application Serial No. 04 012 863.9, filed on May 29, 2004, the entire contents of which are hereby incorporated by reference.

TECHNICAL FIELD

The present invention relates to a beam shaping optics for a diode laser configuration.

BACKGROUND

Diode laser configurations with vertical laser diode stacks (vertical stacks) of laser diode bars, which are actively cooled with microchannel heat sinks, can serve as pumplight sources for diode-pumped high-performance solid state lasers. With a sufficiently large stack height (e.g., approximately 50 laser diode bars), these stacks have an approximately identically sized beam parameter product in a horizontal direction (i.e., along the slow axis ("SA")) and in a vertical direction (i.e., along the fast axis ("FA")). This facilitates coupling of the radiation emitted by these vertical stacks into a nearly rotationally-symmetrical light mixer thereby approximately maintaining the brilliance of the pump radiation. The pump radiation is homogenized in the light mixer through multiple reflection. The radiation emitted from the light mixer is suited to reproduce a round pump spot on a laser crystal. The service life of the actively cooled vertical stacks is limited to only about 10,000 hours.

German patent application, serial number DE 100 61 265 A1, discloses quasi-passively cooled diode laser configurations with horizontal laser diode stacks (i.e., a 2D passive stack, or a horizontal stack, respectively) as pump light source for high-performance solid state lasers. In these diode laser configurations, the individual diode bars are disposed such that they are not on top of each other in the FA direction, but next to each other in the SA direction. Additionally, the individual diode bars can be slightly offset in steps in the FA direction. The horizontal stacks are more reliable than vertical stacks, since the electric function is separate from cooling and also due to the larger cooling structures and the greatly reduced number of sealing elements.

The optical format of the laser beam produced by the laser diode bars disposed next to each other in the SA direction is disadvantageous. In contrast to a vertical stack, the asymmetry of the beam quality of the horizontal stack is further increased along the SA direction by the arrangement of the bars next to each other and by the resulting widening of the overall cross-section of the emitted radiation. Moreover, the relatively large height of the horizontal stacks in the FA direction requires FA collimator lenses with an unusually large focus length for optically aligned stacking in the FA direction. The small divergence of the beams collimated in this manner requires very high precision of the optical components in the further optical path. The overall height of the number of stacked horizontal stacks required for a symmetrical beam quality is moreover too large for practical applications. For this reason, a beam shaping optics is required to obtain approximate symmetry of the output radiation of horizontal stacks.

German patent application, serial number DE 199 39 750 A1, discloses a beam shaping optics for combining three laser beams provided by three diode bars that are disposed in one common horizontal plane, into one superposed laser beam. This optical arrangement reduces the extension of the laser radiation in the SA direction. A correcting optics is disposed in the optical path directly after the diode bars for beam collimation in the FA direction and also in the SA direction. The optical arrangement includes lateral displacement elements for lateral displacement (i.e., parallel displacement) of the two outer laser beams along the SA direction, which include a beam deflecting element and a coupling element (e.g., a prismatic cube).

The German patent application, serial number DE 199 39 750 A1, moreover discloses a beam shaping optics for combining two laser beams provided by diode bars that are disposed next to each other in the SA direction and are offset from each other in small steps in the FA direction, into a combined laser beam. This optical arrangement has two plane-parallel plates disposed on top of each other in the FA direction and at an angle to the incoming radiation in the SA direction, and through which the radiation is transmitted. The refraction of light on the entering and exiting surfaces, which are disposed at an angle to the beam propagation direction, offsets the two incoming laser beams laterally in the SA direction by half the center-to-center distance of the beams each, thereby shifting them on top of each other like a comb (so-called interleaving).

SUMMARY

A beam shaping optics is disclosed that combines multiple laser beams emitted from a horizontal diode laser stack with several diode bars that are mutually offset in steps in such a manner that they can be coupled into an approximately rotationally-symmetric light mixer.

In a first general aspect, a beam shaping optical arrangement combines three incoming laser beams that are mutually laterally offset in two orthogonal directions (X and Y), including an incoming first central laser beam and second and third incoming beams laterally offset in the X direction on either side of the central beam, into one outgoing combined laser beam. The arrangement includes two lateral displacement optical units though which the laterally offset incoming beams are transmitted and that laterally displace the two laterally offset incoming beams along the X direction towards the incoming central beam but which do not laterally offset the incoming central beam. The lateral displacement units include a material having a higher refractive index than a medium located in an optical path of the central laser beam, and the optical path length traversed by the incoming laterally offset laser beams is selected such that, after transmission though the optical units, the diameters of the central laser beam and the laterally offset laser beams are approximately equal at least in the X direction, and a divergence of the central laser beam is approximately equal to a divergence of the laterally offset laser beams.

Implementations can include one or more of the following features. For example, the incoming laser beams and the outgoing laser beam can be parallel to each other. The central laser beam can travel in air. The lateral displacement optical units can be configured to totally internally reflect an incoming second or third laser beam on at least two totally internally reflecting surfaces of a lateral displacement optical unit. The lateral displacement units can be double deflecting prisms.

The arrangement can further include at least one upstream combining stage disposed upstream of the two lateral displacement optical units, where the upstream combining stage is configured to combine fourth and fifth incoming laser beams that are mutually laterally offset in the X and Y directions into the first, second or third laser beam. The upstream combining stage can include third and fourth lateral displacement optical units configured to laterally offset the fourth and fifth incoming laser beams towards the each other along the X direction, and the third and fourth lateral displacement optical units can be plane parallel plates. The laser beams entering the upstream combining stage can enter an entering surface of the plane parallel plates at Brewster's angle to a surface of the plate.

In another general aspect, a module of multiple beam shaping optical arrangements as described above, includes multiple beam shaping optical arrangements that are joined along the Y direction to form a stacked unit.

In a further general aspect, a method of combining multiple laser beams includes providing a first central incoming laser beam, providing second and third incoming laser beams to two lateral displacement optical units, wherein the two incoming laser beams are mutually laterally offset in two orthogonal directions (X and Y) from the first central laser beam on either side of the central beam, and transmitting each of the second and third incoming laser beams through a lateral displacement optical unit to laterally displace the second and third beams along the X direction towards the incoming central beam to combine the first, second, and third beams into an outgoing laser beam. The lateral displacement units include a material having a higher refractive index than a medium located in an optical path of the central laser beam, and the optical path length traversed by the incoming laterally offset laser beams is selected such that, after transmission though the optical units, the diameters of the central laser beam and the laterally offset laser beams are approximately equal at least in the X direction and a divergence of the central laser beam is approximately equal to a divergence of the laterally offset laser beams.

Implementations can include one or more of the following features. For example, the incoming laser beams and the outgoing laser beam can be parallel to each other. The central laser beam can travel in air and not be transmitted through a lateral displacement unit. The second and third beams can be totally internally reflected on at least two totally internally reflecting surfaces of a lateral displacement optical unit. The method can further include combining fourth and fifth incoming laser beams that are mutually laterally offset in the X and Y directions into the first, second or third laser beam. The fourth and fifth incoming beams can be combined by transmitting the fourth and fifth beams through plane parallel plates having entrance and exit surfaces with normal directions that are angled with respect to a propagation direction of the fourth and fifth incoming beams.

The details of one or more implementations are set forth in the accompanying drawings and the description below. Other features will be apparent from the description and drawings, and from the claims.

DESCRIPTION OF DRAWINGS

Like reference symbols in the various drawings indicate like elements.

DETAILED DESCRIPTION

Figure 1:
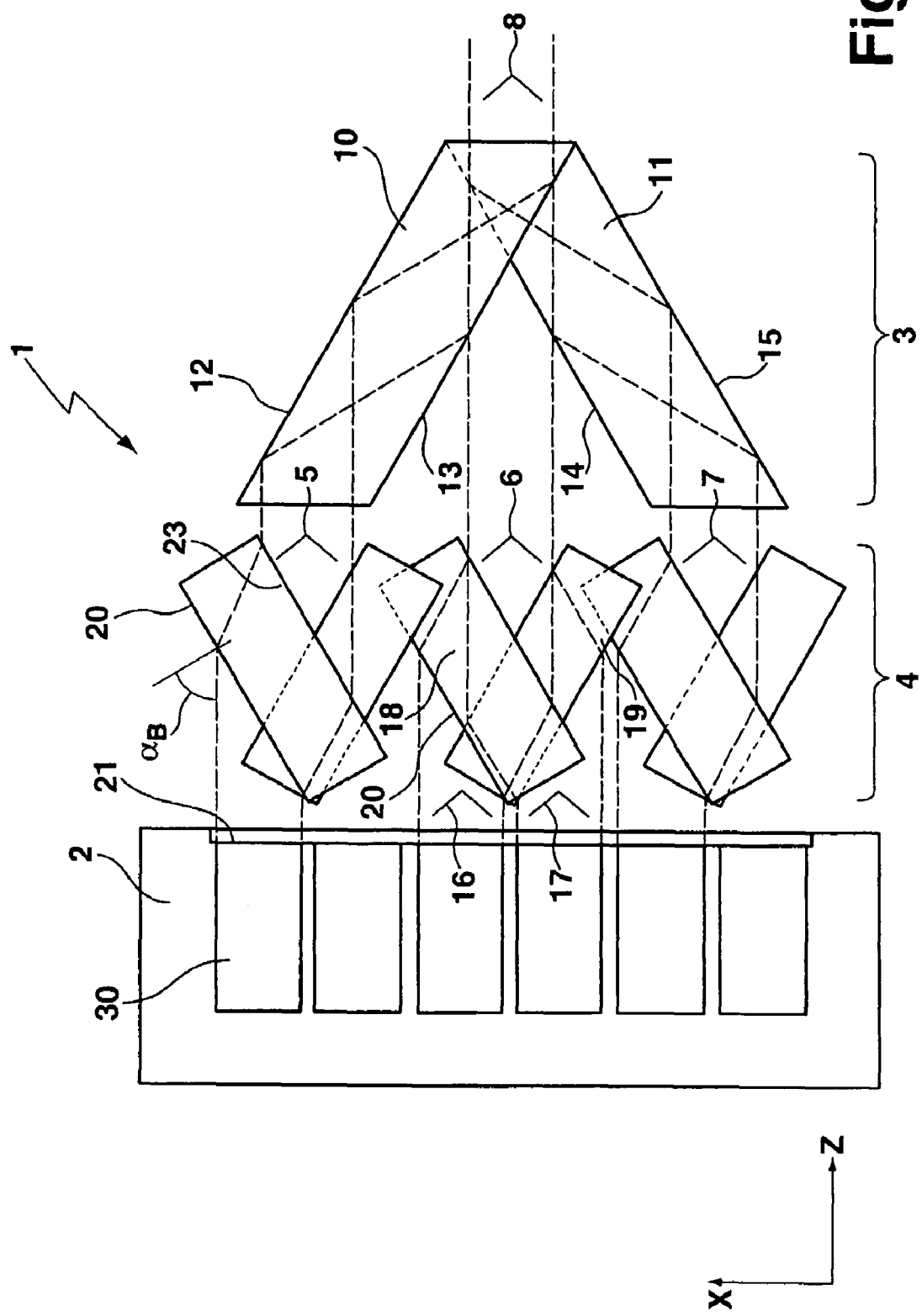
FIG. 1 is a schematic top view of a beam shaping optics for a diode laser arrangement.
Figure 2:
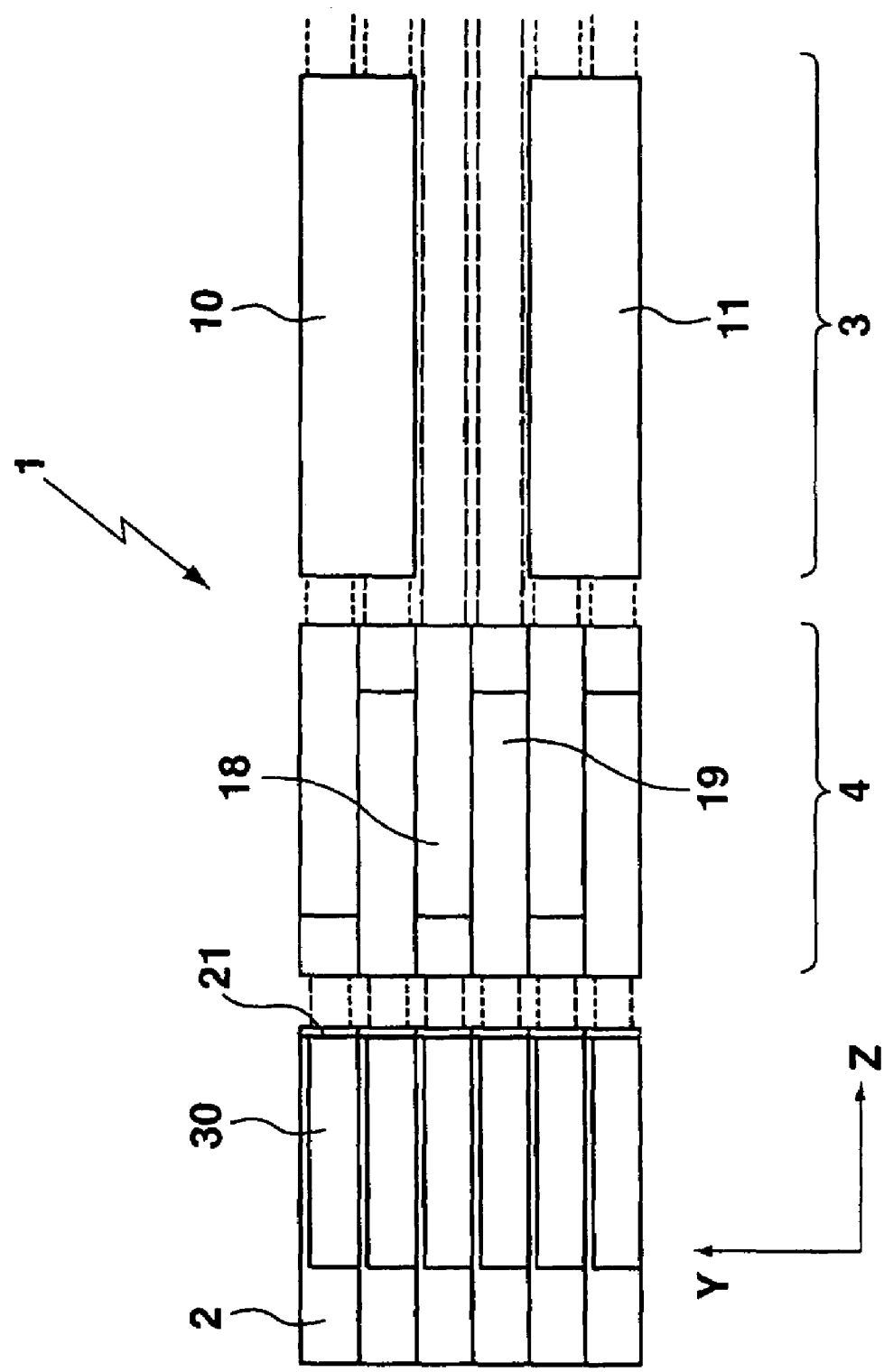
FIG. 2 is a schematic side view of the beam shaping optics of FIG. 1.

The beam shaping optics 1 shown in FIG. 1 and in FIG. 2 serves to combine six laser beams that are emitted parallel to each other in the Z direction by a diode laser arrangement 2 that is designed as a horizontal stack with six diode bars 30, four of which are shown by their peripheral beams in FIG. 1. The laser beams may be provided, e.g., from a horizontal stack, such as the one disclosed in German patent application, serial number DE 100 61 265 A1.

To maximally facilitate the design of the beam shaping optics, the diode bars 30 are disposed such that they are slightly vertically offset from each other, in a so-called "bar pitch." This pitch is typically approximately 1.5 mm, which corresponds to approximately 1.5 to 2 times the extension of a laser beams 16 and 17 in the Y direction (i.e., the FA direction) when it has passed through an FA collimator 21 that directly abuts the diode bars 30. The heat sinks of the diode bars 30 are slightly wedge-shaped in the X direction (i.e., the SA direction) to generate this offset, and identical heat sinks can be used for all diode bars 30. Viewed in the beam direction (i.e., the Z direction), the radiation of the diode bars 30 is disposed in the shape of flat stairs. A cooling plate (not shown) of the horizontal stack 2 is slightly tilted relative to the horizontal SA direction.

The beam shaping optics 1 for combining the laser radiation of the diode bars 30 has two combining stages 3 and 4 that are disposed behind one another in the optical path. In the first combining stage 4, the laser beams 16 and 17 emitted by two neighboring diode bars 30 of the horizontal stack 2 are symmetrically superposed in pairs using two lateral displacement optical units 18 and 19 that are formed by two plane parallel plates disposed at oppositely equal angles to the beam direction. Due to the symmetry of the arrangement, the optical path length for the laser beams from the diode bars 30 in the first combining stage 4 is the same. The plane parallel plates 18 and 19 transmit the beams to generate the horizontal beam offset. The surface normal of an entering surface 20 of the plane parallel plates thereby forms an angle with the laser beams 16 and 17, which corresponds to Brewster's angle, $\alpha_B$, of the material of the plane parallel plates 18 and 19. An anti-reflection coating on the entering and exiting surfaces of the plane parallel plates 18 and 19 can be omitted due to utilization of Brewster's angle, $\alpha_B$, since the diode bars' 30 emission is horizontally polarized. Only two optical surfaces, i.e., the entering surface 20 and an exiting surface 23, with good parallelism are required for a plane parallel plate 18 and 19. The adjustment sensitivity of the plane parallel plates 18 and 19 is small. The direction of the outgoing radiation is not influenced by rotation or displacement of the plane parallel plates 18 and 19.

The incoming laser beams 5, 6, and 7, which are horizontally offset after the first combining stage 4, are completely superposed in the second combining stage of the beam shaping optics 1, such that an outgoing laser beam 8 leaves the beam shaping optics 1 as a vertical optical laser beam stack. The second combining stage 3 has two lateral displacement units 10 and 11 in the form of double deflecting prisms which are positioned such that their entering and exiting surfaces are disposed perpendicularly to the beam propagating direction and their parallel inclined side surfaces 12, 13, 14, and 15 are positioned for pair-wise total internal reflection and therefore for obtaining a horizontal beam offset. The vertical extension of the double deflecting prisms 10 and 11 is twice the bar pitch. Total symmetry is not required in the combining stage 3 since the effective path lengths of the three incoming laser beams 5, 6, and 7 almost have identical lengths. The optical reduction in length through propagation of the two outer laser beams 5 and 7 in the medium with higher refractive index of the double deflecting prisms 10 and 11 is used to compensate for the larger geometrical path length of the two horizontally offset laser beams 5 and 7 with respect to the central laser beam 6. In the present case, only two identical double deflecting prisms 10 and 11 are required to combine the laser radiation of the horizontal stack 2. The central laser beam 6 passes between the two double deflecting prisms 10 and 11 without passing through an optical element.

There are different ways of mechanically fixing the optical elements of the first combining stage 4 and the second combining stage 3. The plane parallel plates 18 and 19 of the first combining stage 4 can be fastened e.g., to the horizontal stack 2. Towards this end, the cooling plates and/or the heat sinks of the horizontal stack 2 must extend to a sufficient extent below the plane parallel plates 18 and 19 and preferably comprise a flat, SA-parallel support surface onto which the plane parallel plates 18 and 19 can be glued. After combination, the outgoing laser beam 8 is focused in the FA direction, using a cylinder lens (not shown), onto the entering surface of a light mixer (not shown) and imaged on this entering surface in the SA direction using a cylinder lens telescope.

Figure 3:
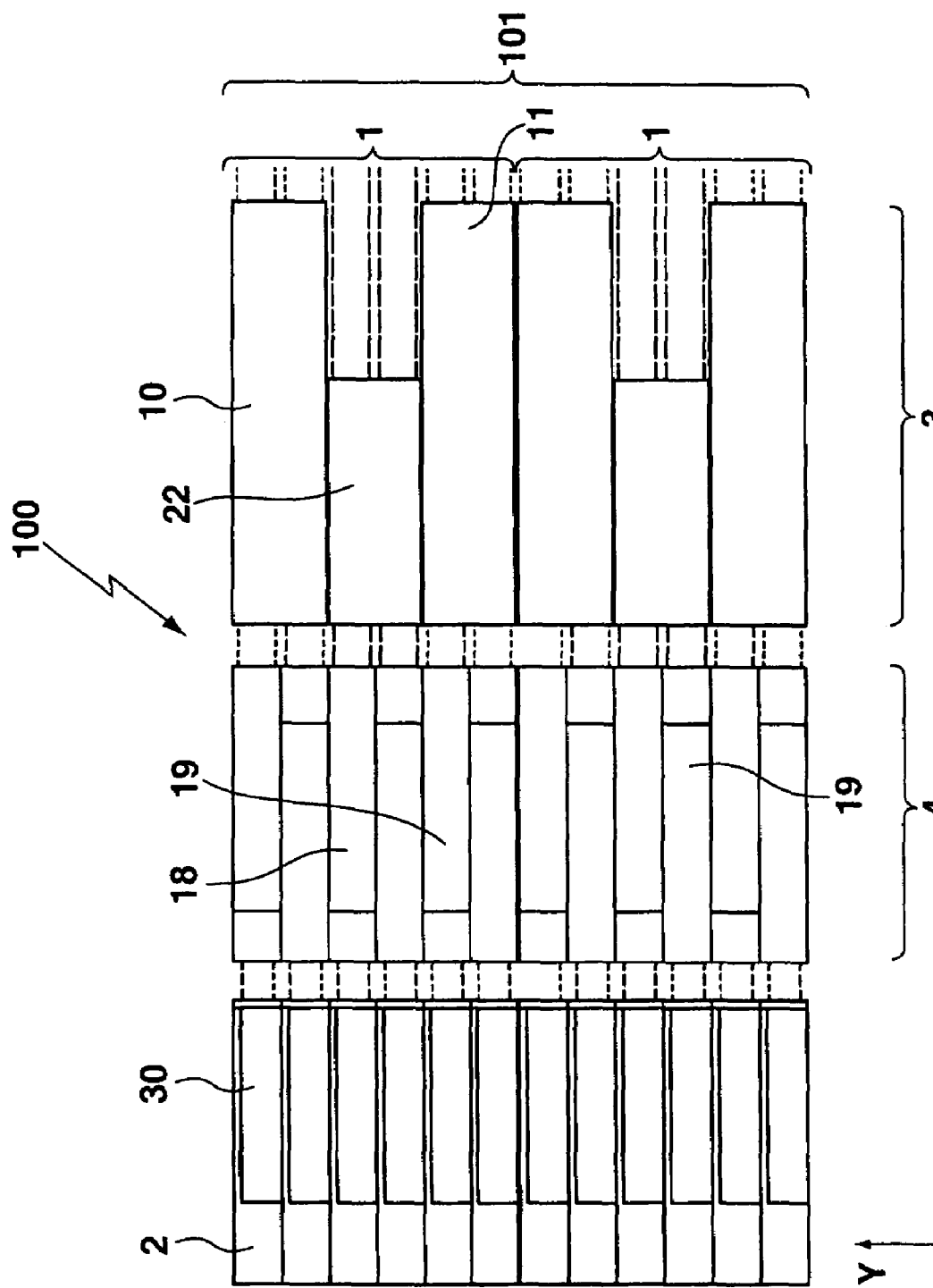
FIG. 3 is a schematic side view of a beam shaping module with two beam shaping optics.

FIG. 3 shows a side view of a beam shaping module 100 with two beam shaping optics 1 of the type shown in FIG. 1, which have identical structures and are stacked on top of each other in the Y direction to form a stacked unit 101. This division of the required number of diode bars 30 into several vertically stacked horizontal stacks 2 produces a very compact format of a pump light source for high-performance solid state lasers. The double deflecting prisms 10 and 11 of the second combining stage 3 can thereby be joined (e.g., glued) for example using additional spacers (e.g., of glass) 22 disposed outside the optical path to form a quasi monolithic stack.

Figure 4:
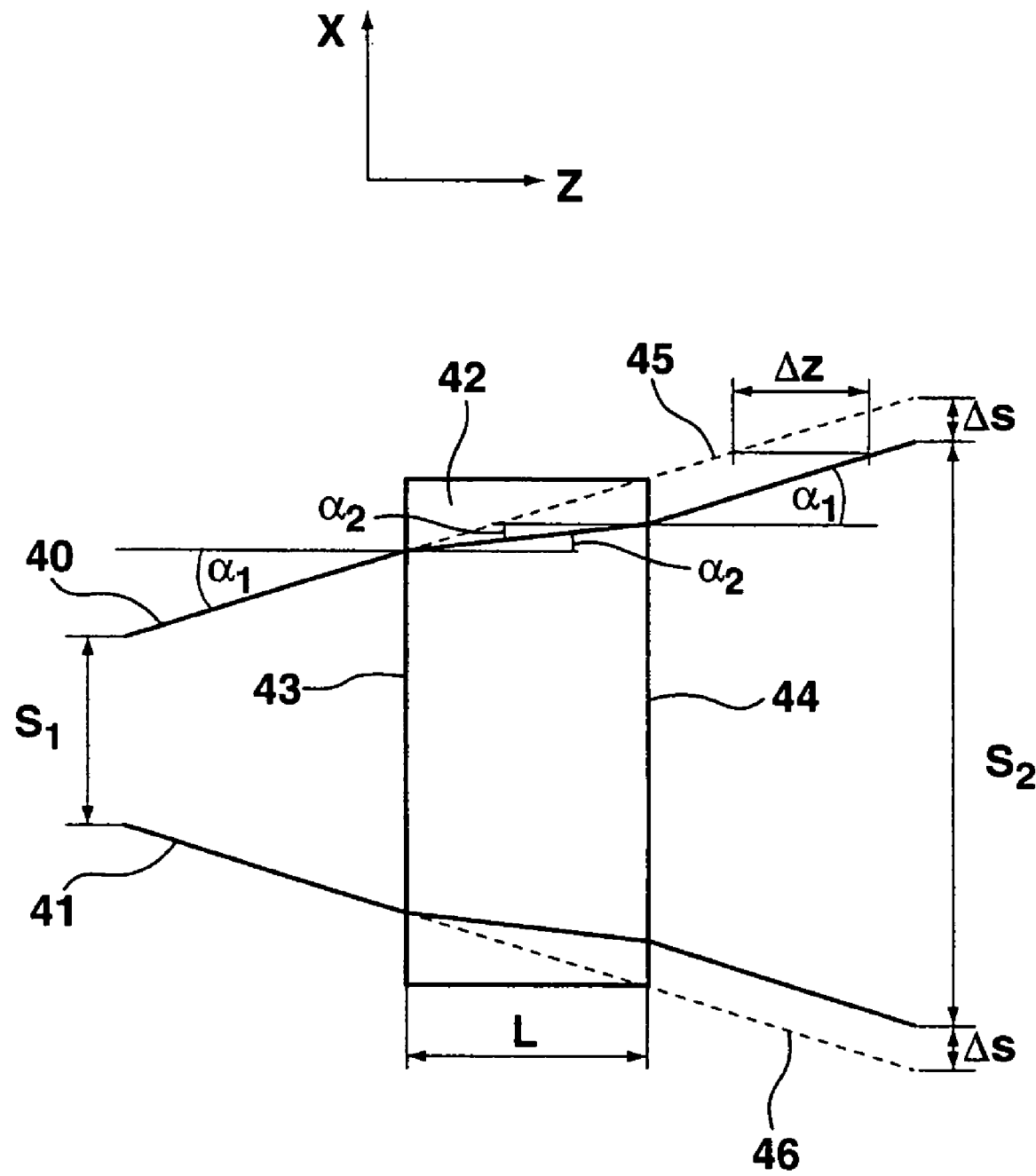
FIG. 4 is a schematic top view of a laser beam passing through a plane plate.

As shown in FIG. 4 the divergence of a laser beam is reduced during passage through a plane plate 42 that has a higher refractive index than the surrounding medium (e.g., air). The laser beam has a diameter, $S_1$, in the X direction before entering into the plane plate 42. The beam is visualized by two peripheral beams 40 and 41 that impinge on an entering surface 43 of the plane plate 42 at an angle, $\alpha_1$, with respect to the normal direction (Z direction). The peripheral beams 40 and 41 are refracted to the incidence normal during passage through the entering surfaces such that they travel within the plane plate 42 at an angle, $\alpha_2$, with respect to the normal direction. The opening angle of the laser beam and hence the beam divergence are therefore smaller within the plane plate 42 having the higher refractive index than in the surrounding medium having the smaller refractive index. When the peripheral beams 40 and 41 pass through an exiting surface 44 of the plane plate 42, they are refracted such that they travel behind the plane plate 42 again at the angle, $\alpha_1$, with respect to the Z direction. The beam divergence before entry of the laser beam into the plane plate 42 and after the laser beam has exited the plane plate 42, are therefore identical. The diameter $S_2$ of the laser beam after exiting the plane plate 42 in the X direction is smaller by an amount, $2\Delta s$, than that of a laser beam that moves exclusively in the medium having the smaller refractive index and does not pass through the plate 42. The peripheral beams 45 and 46 of such a laser beam are shown with dashed lines in FIG. 4. Thus, the diameter of the laser beam in the X direction can be diminished by an amount, $2\Delta s$, through use of the plane plate 42. The axial offset, $\Delta z$, (in the beam direction Z) of the laser beam travelling through the plane plate 42 (of a length L in the beam direction Z) compared to a beam that travels in the air and does not pass through the plane plate 42 can be calculated (for small angles, $\alpha_1$ and $\alpha_2$) approximately as follows: $\Delta z \approx L*(1-\alpha_1/\alpha_2)=L*(1-n_1/n_2)$.

Thus, one laser beam can be emitted by one diode bar, and the diode bars can be disposed next to each other in the first horizontal (SA) direction, and the diode bars can be mutually offset from each other in small steps in a vertical direction. Since typically more than three diode bars are disposed next to each other on a horizontal stack, it may be favorable to provide several combining means next to or behind each other in the optical path of the laser beams.

The first beam shaping optics can combine three entering laser beams, and only two lateral displacement units are required for combining the beams. The geometrical path length of the two outer laser beams through the combining stage is larger than the geometrical path length covered by the central laser beam in the combining stage, due to the lateral displacement. The diameters of the three laser beams at the end of the combining stage are made to be approximately equal through suitable design of the refractive index of the lateral displacement elements and of the path length of the outer laser beams through the lateral displacement elements to ensure that the outgoing combined laser beam has a substantially identical divergence behavior across its beam cross-section. In this manner, the image planes of the three diode bars, which emit the three laser beams, approximately coincide in the beam direction after the combining stage. The combined beams can thereby be focused in a light mixer with additional optical elements (e.g., lenses or lens telescopes) or also directly onto a solid state laser medium.

The beam expansion within an optical medium is smaller in a medium with high refractive index than in a medium with lower refractive index because the light beams are refracted towards the optical axis by the transition to the medium with higher refractive index and therefore travel in the optical medium with smaller divergence. This effect is utilized for adjusting the diameters of the laser beams at the end of the combining stage in that the longer geometrical path through the lateral displacement units is compensated for by a higher refractive index of the optical media in these units. For this reason, the lateral displacement units each have a lateral displacement element with higher refractive index than the medium located in the optical path of the central laser beam in the combining stage. The entering laser beams and the outgoing laser beam can be parallel to each other, which permits compact construction of the beam shaping optics and minimizes adjustment sensitivity.

The central beam can pass through the beam shaping optics completely in the air and therefore can pass through the beam shaping optics without being influenced by an optical element. This minimizes the costs, the adjustment sensitivity of the beam shaping optics, and the radiation intensity loss. The lateral displacement units can generate the lateral displacement through total internal reflection on at least two totally internally reflecting surfaces. If the beam is deflected through total internal reflection, only very little light is lost and totally internally reflecting surfaces need not be coated with a reflecting coating.

The lateral displacement units can be formed as double reflection prisms. The total internal reflection at two side surfaces of double reflection prisms is a particularly simple means of generating a lateral displacement with one single optical element. The adjustment effort and risk of disadjustment is minimized through combination of the two reflection surfaces in one structural element.

A further combining stage can be provided upstream of the first combining stage that combines two incoming laser beams which are laterally mutually offset in the first and second directions, into one combined outgoing laser beam. The upstream combining stage may comprise two lateral displacement units, in particular, plane parallel plates for lateral displacement of the two incoming laser beams towards each other along the first direction. Combination can be optimized with the use of two combining stages. Plane plates are optical elements that can be produced with little cost and provide simple lateral displacement. The incoming laser beam preferably enters an entering surface of the lateral displacement unit at Brewster's angle, wherein undesired reflections on the entering surface (and on the exiting surface) are prevented without reflection-reducing coatings.

A beam shaping module with at least two beam shaping optics of the above-described type which are joined along the second direction into at least one stacked unit can also be provided. The individual beam shaping optics can be identical. The beam shaping module can be used to combine laser beams that are supplied by two or more horizontal stacks that are stacked on top of each other along the second vertical direction (FA).

A number of implementations have been described. Nevertheless, it will be understood that various modifications may be made. Accordingly, other embodiments are within the scope of the following claims.

What is claimed is:

1. A beam shaping optical arrangement for combining three incoming laser beams that are mutually laterally offset in two orthogonal directions (X and Y), including an incoming first central laser beam and second and third incoming beams laterally offset in the X direction on either side of the central beam, into one outgoing combined laser beam, the optical arrangement comprising:
   two lateral displacement optical units through which the laterally offset incoming beams are transmitted and which laterally displace the two laterally offset incoming beams along the X direction towards the incoming central beam but which do not laterally offset the incoming central beam,
   wherein the lateral displacement optical units comprise a material having a higher refractive index than a medium located in an optical path of the central laser beam, and
   wherein the optical path length traversed by the incoming laterally offset laser beams is selected such that, after transmission through the lateral displacement optical units, the diameters of the central laser beam and the laterally offset laser beams are approximately equal at least in the X direction and a divergence of the central laser beam is approximately equal to a divergence of the laterally offset laser beams.

2. The beam shaping optical arrangement of claim 1, wherein the incoming laser beams and the outgoing laser beam are parallel to each other.

3. The beam shaping optical arrangement of claim 1, wherein the central laser beam travels in air.

4. The beam shaping optical arrangement of claim 1, wherein the lateral displacement optical units are configured to totally internally reflect an incoming second or third laser beam on at least two totally internally reflecting surfaces of a lateral displacement optical unit.

5. The beam shaping optical arrangement of claim 4, wherein the lateral displacement units are double deflecting prisms.

6. The beam shaping optical arrangement of claim 1, further comprising at least one upstream combining stage disposed upstream of the two lateral displacement optical units, wherein the upstream combining stage is configured to combine fourth and fifth incoming laser beams that are mutually laterally offset in the X and Y directions into the first, second or third laser beam.

7. The beam shaping optical arrangement of claim 6, wherein the upstream combining stage comprises third and fourth lateral displacement optical units configured to laterally offset the fourth and fifth incoming laser beams towards the each other along the X direction.

8. The beam shaping optical arrangement of claim 6, wherein the third and fourth lateral displacement optical units are plane parallel plates.

9. The beam shaping optical arrangement of claim 8, wherein the laser beams entering the upstream combining stage enter an entering surface of the plane parallel plates at Brewster's angle to a surface of the plate.

10. A module of multiple beam shaping optical arrangements according to claim 1, wherein the arrangements are joined along the Y direction to form a stacked unit.

11. A module of multiple beam shaping optical arrangements according to claim 6 wherein the arrangements are joined along the Y direction to form a stacked unit.

12. A method of combining multiple laser beams, the method comprising:
    providing a first central incoming laser beam;
    providing second and third incoming laser beams to two lateral displacement optical units, wherein the two incoming laser beams are mutually laterally offset in two orthogonal directions (X and Y) from the first central laser beam on either side of the central beam;
    transmitting each of the second and third incoming laser beams through a lateral displacement optical unit to laterally displace the second and third beams along the X direction towards the incoming central beam to combine the first, second, and third beams into an outgoing laser beam,
    wherein the lateral displacement units comprise a material having a higher refractive index than a medium located in an optical path of the central laser beam, and
    wherein the optical path length traversed by the incoming laterally offset laser beams is selected such that, after transmission through the lateral displacement optical units, the diameters of the central laser beam and the laterally offset laser beams are approximately equal at least in the X direction and a divergence of the central laser beam is approximately equal to a divergence of the laterally offset laser beams.

13. The method of claim 12, wherein the incoming laser beams and the outgoing laser beam are parallel to each other.

14. The method of claim 12, wherein the central laser beam travels in air and is not transmitted through a lateral displacement unit.

15. The method of claim 12, wherein the second and third beams are totally internally reflected on at least two totally internally reflecting surfaces of a lateral displacement optical unit.

16. The method claim 12, further comprising combining fourth and fifth incoming laser beams that are mutually laterally offset in the X and Y directions into the first, second or third laser beam.

17. The method of claim 16, further comprising combining the fourth and fifth incoming beams by transmitting the fourth and fifth beams through plane parallel plates having entrance and exit surfaces with normal directions that are angled with respect to a propagation direction of the fourth and fifth incoming beams.

* * * * *